United States Patent
Ku et al.

(10) Patent No.: US 6,720,235 B2
(45) Date of Patent: Apr. 13, 2004

(54) METHOD OF FORMING SHALLOW TRENCH ISOLATION IN A SEMICONDUCTOR SUBSTRATE

(75) Inventors: Tzu-Kun Ku, Taipei (TW); Chian-Kai Huang, Kaohsiung (TW)

(73) Assignee: Silicon Integrated System Corp. (TW)

( * ) Notice: Subject to any disclaimer, the term of this patent is extended or adjusted under 35 U.S.C. 154(b) by 0 days.

(21) Appl. No.: 10/237,693

(22) Filed: Sep. 10, 2002

(65) Prior Publication Data

US 2004/0048443 A1 Mar. 11, 2004

(51) Int. Cl.$^7$ .............................................. H01L 21/762
(52) U.S. Cl. .................... 438/435; 438/437; 438/692
(58) Field of Search .............. 257/21.546; 438/424–438, 438/FOR 227

(56) References Cited

U.S. PATENT DOCUMENTS

| | | | |
|---|---|---|---|
| 6,083,808 A | * | 7/2000 | Shin et al. .................. 438/435 |
| 6,350,662 B1 | | 2/2002 | Thei et al. |
| 6,461,950 B2 | * | 10/2002 | Yin et al. .................... 438/585 |

OTHER PUBLICATIONS

Ghandhi, S. VLSI Fabrication Principles, John Wiley and Sons, Inc. p. 518, 1983.*
Wolf, S., et al., Silicon Processing for the VLSI Era:Process Technology, Lattice Press, p. 534.*

* cited by examiner

*Primary Examiner*—George Fourson
(74) *Attorney, Agent, or Firm*—Birch, Stewart, Kolasch & Birch, LLP

(57) ABSTRACT

A method of forming shallow trench isolation in a semiconductor substrate. A hard mask having an opening is formed on the semiconductor substrate. The semiconductor substrate is etched through the opening to form a shallow trench. The semiconductor substrate is annealed in an ambient containing argon gas at a temperature of about 1150 to about 1200° C. for 1 to 2 hrs. An insulator is then formed on the hard mask to fill the shallow trench. The insulator is planarized while the hard mask is used as the polishing stop layer. Thereafter, the hard mask is removed to expose the upper surface of the semiconductor substrate and leave a shallow trench isolation.

16 Claims, 3 Drawing Sheets

METHOD OF FORMING SHALLOW TRENCH ISOLATION IN A SEMICONDUCTOR SUBSTRATE

BACKGROUND OF THE INVENTION

1. Field of the Invention

The present invention relates to the manufacture of semiconductor devices, and more particularly to a method of forming shallow trench isolation in a semiconductor substrate to reduce stress caused by etching for shallow trench.

2. Description of the Related Art

In the integrated circuit (IC) industry, shallow trench isolation (STI) is replacing conventional local oxidation of silicon (LOCOS) in order to form improved field isolation structure. The basic STI technology involves etching of the semiconductor substrate to form trenches and then refilling the trenches with an insulating material to produce an isolation region followed by planarization of the insulating material by chemical mechanical polishing (CMP). The steps mentioned above may cause mechanical or thermal stress in the active semiconductor substrate. These stress are believed to cause dislocations or defect sites in the active substrate. Accordingly, it has been found that there exists a high leakage current path along the source and drain regions of a transistor device formed during subsequent steps in the semiconductor substrate, thereby rendering a lower yield.

U.S. Pat. No. 6,350,662 to Thei et al. discloses a method of reducing defects in shallow trench isolation using nitrogen annealing for 30 to 150 minutes. Defects, dislocations, interface traps, and stress in the semiconductor substrate can be reduced or eliminated.

However, silicon nitride may be generated in the semiconductor substrate during nitrogen annealing, affecting ion implantation for well regions and source/drain regions in the subsequent steps.

Therefore, a need has arisen for a method of forming shallow trench isolation in a semiconductor substrate that can eliminate or reduce stress caused by bombardment during reactive ion etching for the shallow trench.

SUMMARY OF THE INVENTION

In view of the above disadvantages, an object of the invention is to provide a method of forming shallow trench isolation in a semiconductor substrate. This method is capable of reducing or eliminating stress.

A further object of the invention is to improve the semiconductor device performance.

A further object of the invention is to prevent formation of silicon nitride in the semiconductor substrate caused by the nitrogen annealing mentioned above.

In accordance with one aspect of the invention, there is provided a method of forming shallow trench isolation in a semiconductor substrate. A hard mask having an opening is formed on the semiconductor substrate. The semiconductor substrate is etched through the opening to form a shallow trench. The semiconductor substrate is annealed in an ambient containing argon gas. An insulator is then formed on the hard mask to fill the shallow trench. The insulator is planarized while the hard mask is used as the polishing stop layer. Thereafter, the hard mask is removed to expose the upper surface of the semiconductor substrate and leave a shallow trench isolation.

The semiconductor substrate is preferably annealed after the semiconductor substrate is pre-cleaned by a standard clean solution such as a diluted $NH_4OH/H_2O_2$ solution (known as "SC1") or diluted $NH_4OH/HCl$ solution (SC2) followed by cleaning the semiconductor substrate with deionized water.

Furthermore, the semiconductor substrate is preferably annealed at 1150 to 1200° C. in an ambient containing argon gas for 1 to 2 hours.

In accordance with another aspect of the invention, there is provided a method of forming shallow trench isolation in a semiconductor substrate, preferably silicon substrate. The hard mask preferably comprises a thermal pad oxide formed on the upper surface of the semiconductor substrate and a pad nitride deposited on the pad oxide.

In accordance with a further aspect of the invention, there is provided a method of forming shallow trench isolation in a semiconductor substrate. The shallow trench is preferably formed by anisotropic etching using a reactive gas containing HBr, Cl, and $CF_4$.

In accordance with yet another aspect of the invention, the insulator is preferably silicon oxide deposited by high-density plasma chemical vapor deposition (HDPCVD). If necessary, a liner oxide and/or liner nitride is conformally formed on the interior surface of the shallow trench before formation of the insulator deposited by HDPCVD.

In accordance with a still further aspect of the invention, there is provided a method of forming shallow trench isolation in a semiconductor substrate. The insulator is planarized by chemical mechanical polishing or etching back until the upper surfaces of the semiconductor substrate and the hard mask are approximately coplanar.

According to the method of the invention, the semiconductor substrate near the shallow trench has no undesirable silicon nitride thus improving the semiconductor device performance.

BRIEF DESCRIPTION OF THE DRAWINGS

The preferred embodiment of the invention is hereinafter described with reference to the accompanying drawings in which.

DETAILED DESCRIPTION OF THE INVENTION

Figure 1:
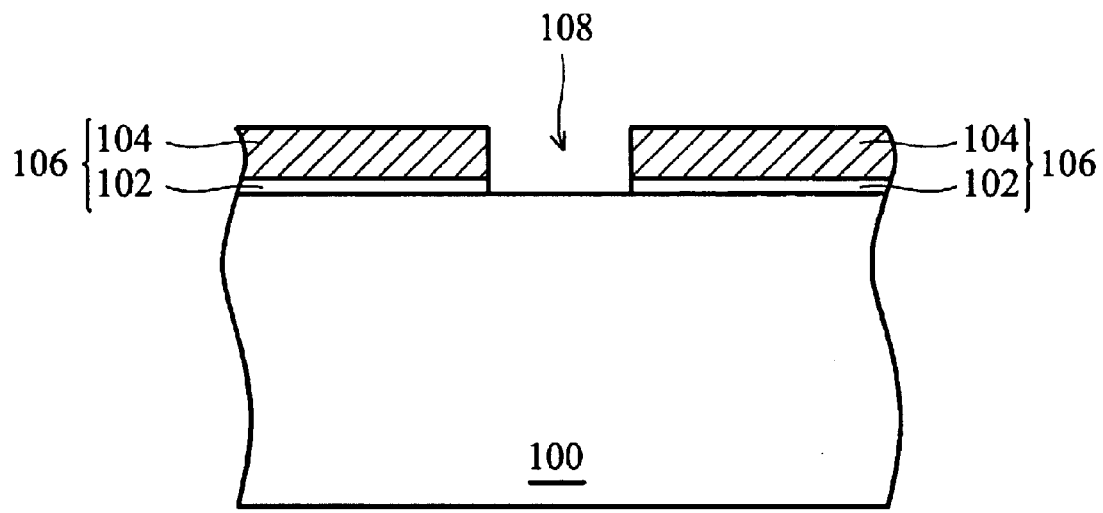
FIGS. 1 to 5 are cross-sections showing the steps of forming shallow trench isolation in a semiconductor substrate in accordance with the embodiment of the invention.

As shown in FIG. 1, a semiconductor substrate 100 consisting of single crystalline silicon is provided. A pad oxide 102, having a thickness of about 200 to 400 angstroms, is grown on the semiconductor substrate 100 in an ambient containing oxygen at a temperature of about 800 to 1000° C. This pad oxide 120 is used to increase bonding strength of the subsequently formed pad nitride to the semiconductor substrate 100. Next, a pad nitride 104, having a thickness of about 1000 to 2000 angstroms, is deposited on the pad oxide 102 by low-pressure chemical vapor deposition (LPCVD) using a mixture of gaseous $Si_2Cl_2$ and $NH_3$, about 0.1 Torr to 1.0 Torr, as the deposition source and at a temperature of from 700° C. to 800° C.

Thereafter, a photoresist pattern (not shown) is formed by conventional photolithography. The pad nitride 104 and the pad oxide 102 are anisotropically etched by reactive ion etching (RIE) to expose the upper surface of the semiconductor substrate 100 and form a hard mask 106 having an opening 108. The hard mask 106 consists of the remaining pad oxide 102 and the pad nitride 104. The photoresist pattern is then stripped.

Figure 2:
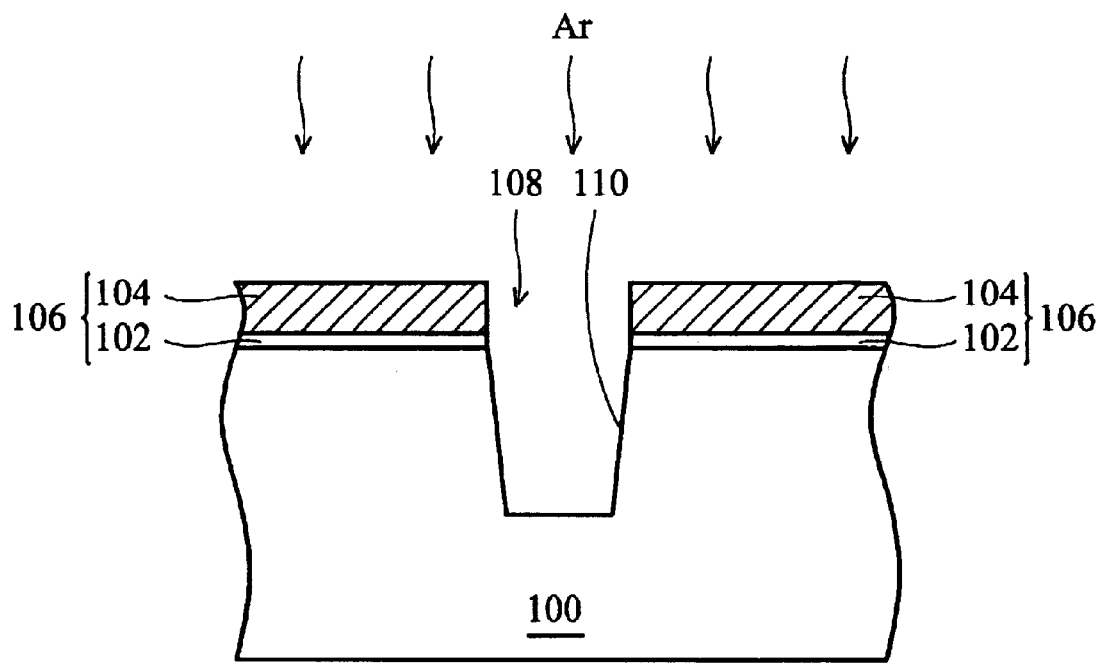

Referring now to FIG. 2, the semiconductor substrate 100 is etched by an etching tool using a reactive gas comprising HBr, Cl, or $CF_4$ through the opening 108 of the hard mask 106. In this etching step, a shallow trench 110 having a depth of about 3000 to 5000 angstroms is created. Mechanical stress is produced in the semiconductor substrate 100 near the sidewall of the shallow trench 110. Next, the semiconductor substrate 100 is cleaned by standard clean solutions such as a diluted $NH_4OH/H_2O_2$ solution (known as "SC1") or a diluted $NH_4OH/HCl$ solution (SC2) combined with deionized water.

Next, the semiconductor substrate 100 is annealed at a temperature of about 1150 to 1200° C. in an ambient containing argon gas for 1 to 2 hours. This annealing process is performed to reduce or remove stress in the semiconductor substrate 100 caused by etching for the shallow trench 110. Argon gas cannot react with the semiconductor substrate 100 so the silicon nitride problem in the conventional technique is solved.

Figure 3:
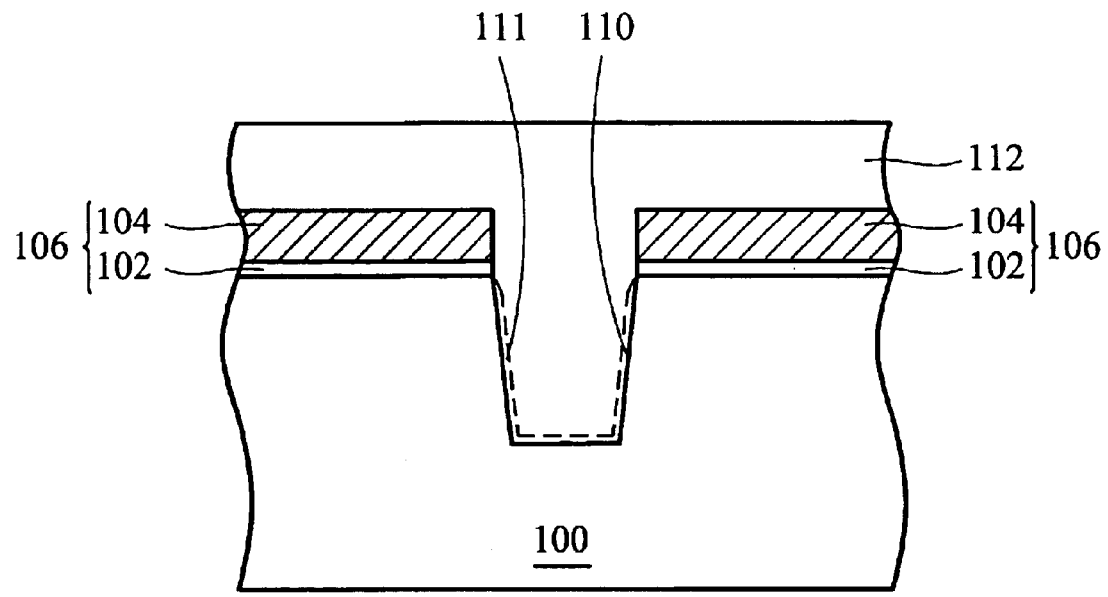

As shown in FIG. 3, an insulator 112 such as silicon oxide is deposited in the shallow trench 110 by high-density plasma chemical vapor deposition (HDPCVD) using tetra-ethyl-ortho-silicate (TEOS) and ozone. Alternately, a reactive gas containing silane and oxygen can be used to replace TEOS and ozone. To reduce damage to the semiconductor substrate 100 caused by the bombardment effect of the high-density plasma, a liner oxide 111 and/or liner nitride (not shown) is preferably formed on the shallow trench 110 before formation of the insulator 112.

Figure 4:
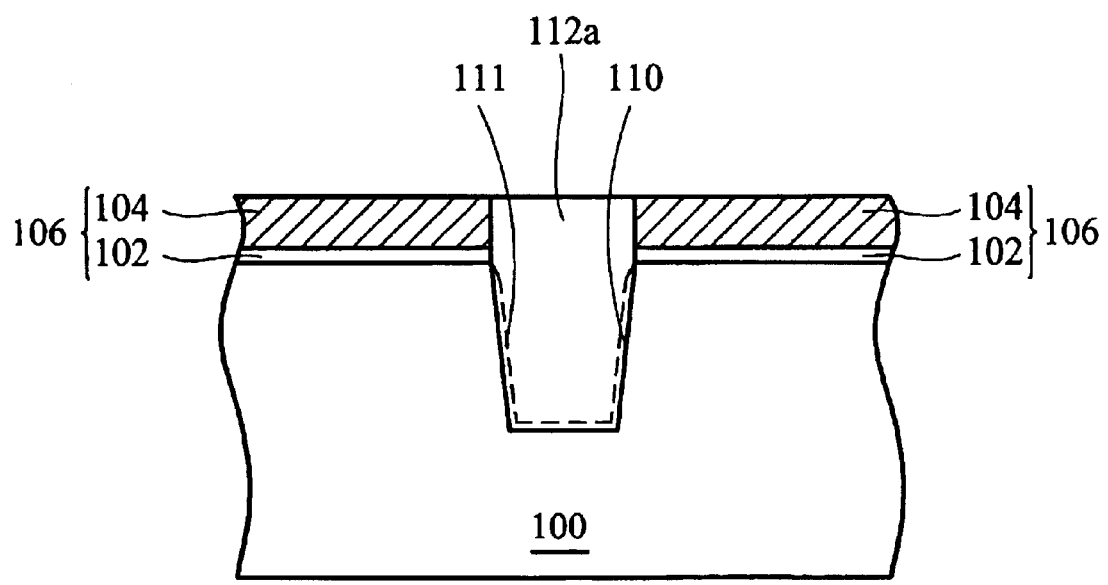

Referring now to FIG. 4, the insulator 112 is planarized by chemical mechanical polishing (CMP) while the hard mask 106 is used as the polishing stop layer so as to leave an insulator 112a whose upper surface is approximately coplanar with the hard mask 106. After this CMP process, more mechanical stress is accumulated in the semiconductor substrate 100 near the shallow trench 110.

Figure 5:
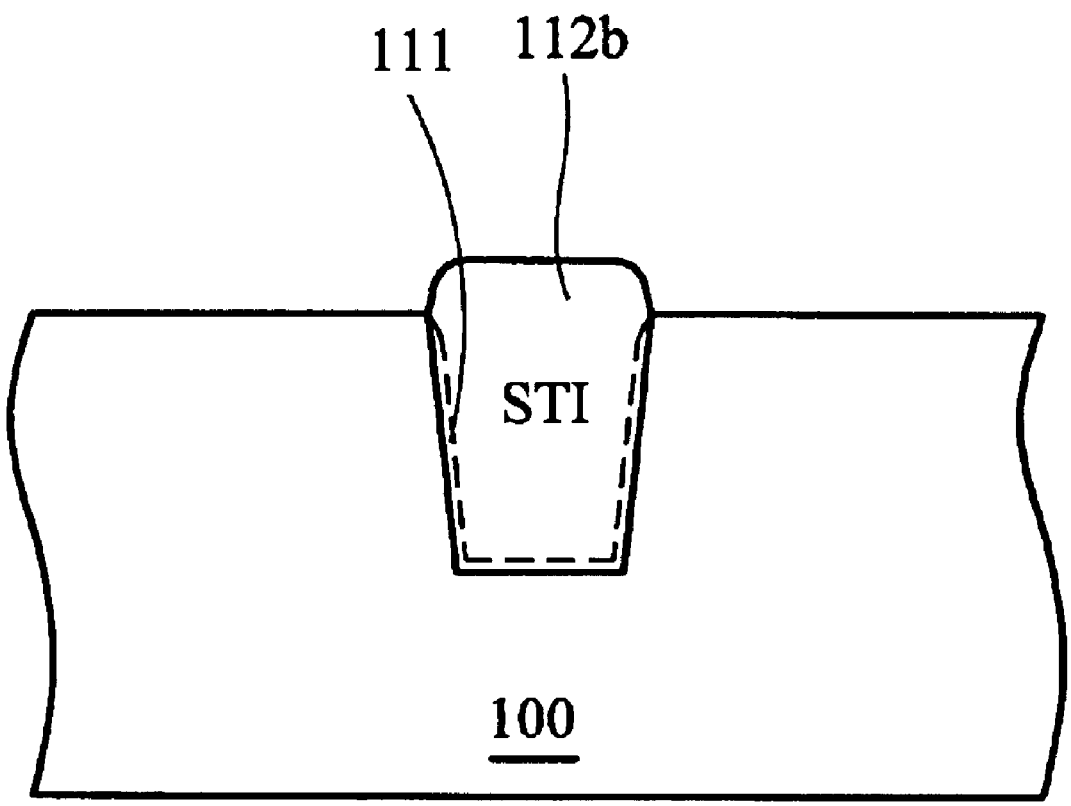

As shown in FIG. 5, a hot phosphoric acid solution is used to remove the pad nitride 104 followed by removal of the pad oxide 102 using a hydrofluoric acid solution until the upper surface of the semiconductor substrate 100 is exposed. In this wet etch process, the insulator 112a is damaged to leave an insulator 112b.

According to the method of forming shallow trench isolation in a semiconductor substrate of the invention, stress in the semiconductor substrate near shallow trench isolation can be reduced or eliminated, thus improving semiconductor device performance.

While the invention has been described with reference to various illustrative embodiments, the description is not intended to be construed in a limiting sense. Various modifications of the illustrative embodiments, as well as other embodiments of the invention, will be apparent to those skilled in the art upon reference to this description. It is therefore contemplated that the appended claims will cover any such modifications or embodiments as may fall within the scope of the invention defined by the following claims and their equivalents.

What is claimed is:

1. A method of forming shallow trench isolation in a semiconductor substrate, comprising the steps in sequence of:

forming a hard mask having a opening on the semiconductor substrate;

etching the semiconductor substrate through the opening to form a shallow trench;

annealing the semiconductor substrate in an ambient containing argon gas;

forming a liner oxide on the surface of the shallow trench followed by deposition of a silicon oxide layer by high-density plasma chemical vapor deposition (HDPCVD) to form an insulator on the hard mask to fill the shallow trench;

planarizing the insulator while the hard mask is used as the polishing stop layer; and removing the hard mask to expose the upper surface of the semiconductor substrate and leave a shallow trench insulation.

2. A method of forming shallow trench isolation in a semiconductor substrate as claimed in claim 1, wherein the semiconductor substrate is silicon.

3. A method of forming shallow trench isolation in a semiconductor substrate as claimed in claim 2, wherein the hard mask comprises a pad oxide formed on the semiconductor substrate and a pad nitride formed on the pad oxide.

4. A method of forming shallow trench isolation in a semiconductor substrate as claimed in claim 2, wherein formation of the shallow trench is performed by anisotropic etching using a reactive gas containing HBr, Cl, and $CF_4$.

5. A method of forming shallow trench isolation in a semiconductor substrate as claimed in claim 1, wherein the insulator is planarized by chemical mechanical polishing.

6. A method of forming shallow trench isolation in a semiconductor substrate as claimed in claim 1, wherein the hard mask is removed by a phosphoric acid solution.

7. A method of forming shallow trench isolation in a semiconductor substrate as claimed in claim 1, wherein the semiconductor substrate is annealed in an ambient containing argon gas for 1 to 2 hours.

8. A method of forming shallow trench isolation in a semiconductor substrate as claimed in claim 1, wherein semiconductor substrate is annealed at a temperature of about 1150 to about 1200° C.

9. A method of forming shallow trench isolation in a semiconductor substrate as claimed in claim 1, further comprising the step of cleaning the semiconductor substrate with the shallow trench after etching the semiconductor substrate for the shallow trench.

10. A method of forming shallow trench isolation in a semiconductor substrate as claimed in claim 9, wherein the semiconductor substrate is cleaned by a standard clean solution of a diluted solution containing $NH_4OH$ and $H_2O_2$ or a diluted solution containing $NH_4OH$ and HCl.

11. A method of forming shallow trench isolation in a semiconductor substrate, comprising the steps in sequence of:

forming a hard mask having an opening on the semiconductor substrate;

etching the semiconductor substrate through the opening to form a shallow trench;

cleaning the semiconductor substrate with the shallow trench;

annealing the semiconductor substrate in an ambient containing argon gas at a temperature of about 1150 to about 1200° C. for 1 to 2 hrs;

forming a liner oxide on the surface of the shallow trench followed by deposition of a silicon oxide layer by high-density plasma chemical vapor deposition (HDPCVD) to form an insulator on the hard mask to fill the shallow trench;

planarizing the insulator while the hard mask is used as the polishing stop layer; and removing the hard mask to expose the upper surface of the semiconductor substrate.

12. A method of forming shallow trench isolation in a semiconductor substrate as claimed in claim 11, wherein the semiconductor substrate is silicon substrate.

13. A method of forming shallow trench isolation in a semiconductor substrate as claimed in claim 11, wherein the hard mask comprises a pad oxide formed on the semiconductor substrate and a pad nitride formed on the pad oxide.

14. A method of forming shallow trench isolation in a semiconductor substrate as claimed in claim 12, wherein formation of the shallow trench is performed by anisotropic etching using a reactive gas containing HBr, Cl, and $CF_4$.

15. A method of forming shallow trench isolation in a semiconductor substrate as claimed in claim 11, wherein the insulator is planarized by chemical mechanical polishing.

16. A method of forming shallow trench insolation in a semicoductor substrate as claimed in claim 11, wherein the hard mask is removed by a phosphoric acid solution.

* * * * *